(12) United States Patent
Horiuchi

(10) Patent No.: US 7,149,104 B1
(45) Date of Patent: Dec. 12, 2006

(54) STORAGE AND RECOVERY OF DATA BASED ON CHANGE IN MIS TRANSISTOR CHARACTERISTICS

(75) Inventor: Tadahiko Horiuchi, Isehara (JP)

(73) Assignee: Nscore Inc., Fukuoka (JP)

( * ) Notice: Subject to any disclaimer, the term of this patent is extended or adjusted under 35 U.S.C. 154(b) by 5 days.

(21) Appl. No.: 11/180,125

(22) Filed: Jul. 13, 2005

(51) Int. Cl.
*G11C 11/00* (2006.01)

(52) U.S. Cl. .................. 365/154; 365/182; 365/185.08

(58) Field of Classification Search ................ 365/154, 365/182, 185.08
See application file for complete search history.

(56) References Cited

U.S. PATENT DOCUMENTS

| | | | |
|---|---|---|---|
| 3,636,530 A | 1/1972 | Mark et al. | |
| 4,419,744 A | 12/1983 | Rutter | |
| 5,956,269 A | 9/1999 | Ouyang et al. | |
| 6,038,168 A | 3/2000 | Allen et al. | |
| 6,466,482 B1 * | 10/2002 | Shukuri et al. | 365/185.24 |
| 6,906,953 B1 | 6/2005 | Forbes | |
| 6,906,962 B1 | 6/2005 | Layman et al. | |
| 6,909,635 B1 | 6/2005 | Forbes et al. | |
| 2005/0232009 A1 * | 10/2005 | Nakamura | 365/185.08 |

FOREIGN PATENT DOCUMENTS

| | | |
|---|---|---|
| JP | 06 076582 | 3/1994 |
| WO | WO 2004 057621 | 7/2004 |

* cited by examiner

*Primary Examiner*—Hoai V. Ho
(74) *Attorney, Agent, or Firm*—Ladas & Parry LLP

(57) ABSTRACT

A memory circuit includes a latch having a first node and a second node, a word selecting line, a first MIS transistor having the source/drain nodes thereof coupled to the first node and a predetermined node, respectively, and the gate node thereof coupled to the word selecting line, a second MIS transistor having the source/drain nodes thereof coupled to the second node and the predetermined node, respectively, and the gate node thereof coupled to the word selecting line, and a control circuit configured to subject in a write mode, one of the first MIS transistor and the second MIS transistor to bias conditions that cause a lingering change in transistor characteristics thereof, and to subject in a recovery mode both the first MIS transistor and the second MIS transistor for equal amount of time to equal bias conditions that cause a lingering change in transistor characteristics thereof.

18 Claims, 9 Drawing Sheets

STORAGE AND RECOVERY OF DATA BASED ON CHANGE IN MIS TRANSISTOR CHARACTERISTICS

BACKGROUND OF THE INVENTION

1. Field of the Invention

The present invention generally relates to a memory circuit, and particularly relates to a nonvolatile memory circuit which is capable of retaining stored data in the absence of a power supply voltage.

2. Description of the Related Art

Nonvolatile semiconductor memory devices, which can retain stored data even when power is turned off, include flash EEPROMs employing a floating gate structure, FeRAMs employing a ferroelectric film, MRAMs employing a ferromagnetic film, etc.

In the case of EEPROMs, there is a need to manufacture a transistor having a special structure comprised of a floating gate. In the case of FeRAMs and MRAMs, which achieve nonvolatile storage by use of a ferroelectric material and a ferromagnetic material, respectively, there is a need to form and process a film made of these respective materials. The need for such transistor having a special structure and the need for such film made of a special material are one of the factors that result in an increase in the manufacturing costs.

PCT/JP2003/016143, which was filed on Dec. 17, 2003, the entire contents of which are hereby incorporated by reference, discloses a memory cell (i.e., a basic unit of data storage) comprised of a pair of transistors which are configured to experience a hot-carrier effect on purpose for storage of one-bit data. A difference in the transistor characteristics caused by the hot-carrier effect represents one-bit data "0" or "1".

Specifically, when one of the two transistors is subjected to a hot-carrier effect, a difference in the ON current develops between the two transistors. The difference in the ON current may be detected by a one-bit static memory circuit (latch) coupled to the transistor pair.

A hot-carrier effect is essentially a charge trap phenomenon by which charge is trapped in a gate-oxide film or the generation of interface state at the Si—SiO2 interface of the gate-oxide film. Such physical damages tend to cure themselves with the passage of time. Namely, as time passes, the threshold voltage or ON current of a transistor changed by a hot-carrier effect returns to its original state.

When a change in the transistor characteristics caused by a hot-carrier effect is used as a means for nonvolatile data storage, the curing effect as described above serves to diminish the range of stable operation of the memory circuit. In the worst cases, data may be lost.

Accordingly, there is a need for a nonvolatile memory circuit utilizing a hot-carrier effect as a means for nonvolatile data storage in which a decrease in the range of stable operation and the loss of data caused by the curing effect are prevented.

SUMMARY OF THE INVENTION

It is a general object of the present invention to provide a nonvolatile memory circuit that substantially obviates one or more problems caused by the limitations and disadvantages of the related art.

It is another and more specific object of the present invention to provide a hot-carrier-effect-based nonvolatile memory circuit in which a decrease in the range of stable operation and the loss of data caused by the curing effect are prevented.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile memory circuit particularly pointed out in the specification in such full, clear, concise, and exact terms as to enable a person having ordinary skill in the art to practice the invention.

To achieve these and other advantages in accordance with the purpose of the invention, the invention provides a memory circuit, which includes a latch having a first node and a second node configured to be bi-stable with a potential of the first node inverse to a potential of the second node, a word selecting line, a first MIS transistor having one of source/drain nodes thereof coupled to the first node of said latch, another one of the source/drain nodes thereof coupled to a predetermined node, and a gate node thereof coupled to said word selecting line, a second MIS transistor having one of source/drain nodes thereof coupled to the second node of said latch, another one of the source/drain nodes thereof coupled to said predetermined node, and a gate node thereof coupled to said word selecting line, and a control circuit configured to subject in a write mode, one of said first MIS transistor and said second MIS transistor to bias conditions that cause a lingering change in transistor characteristics thereof, and to subject in a recovery mode both said first MIS transistor and said second MIS transistor for equal amount of time to equal bias conditions that cause a lingering change in transistor characteristics thereof.

According to another aspect of the present invention, a semiconductor memory device includes a control circuit, word lines extending from said control circuit, word selecting lines extending from said control circuit, a plurality of memory units arranged in a matrix, one of said memory units coupled to a first bit line and a second bit line, said one of said memory units including a latch having a first node and a second node configured to be bi-stable with a potential of the first node inverse to a potential of the second node, a first MIS transistor having one of source/drain nodes thereof coupled to the first node of said latch, another one of the source/drain nodes thereof coupled to a predetermined node, and a gate node thereof coupled to said word selecting line, a second MIS transistor having one of source/drain nodes thereof coupled to the second node of said latch, another one of the source/drain nodes thereof coupled to said predetermined node, and a gate node thereof coupled to said word selecting line, a third transistor having a gate thereof coupled to one of said word lines and source/drain nodes thereof coupled to the first node and the first bit line, respectively, and a fourth transistor having a gate thereof coupled to said one of said word lines and source/drain nodes thereof coupled to the second node and the second bit line, respectively, wherein said control circuit is configured to subject in a write mode, one of said first MIS transistor and said second MIS transistor to bias conditions that cause a lingering change in transistor characteristics thereof, and to subject in a recovery mode both said first MIS transistor and said second MIS transistor for equal amount of time to equal bias conditions that cause a lingering change in transistor characteristics thereof.

According to another aspect of the present invention, a method of writing and recovering data in a memory cell is provided. The memory cell includes a word selecting line, a first MIS transistor having one of source/drain nodes thereof coupled to a first node, another one of the source/drain nodes thereof coupled to a common node, and a gate node thereof coupled to said word selecting line, and a second MIS transistor having one of source/drain nodes thereof coupled to a second node, another one of the source/drain nodes thereof coupled to said common node, and a gate node thereof coupled to said word selecting line. The method includes a write step of subjecting one of said first MIS transistor and said second MIS transistor to bias conditions that cause a lingering change in transistor characteristics thereof, and a recovery step of subjecting both said first MIS transistor and said second MIS transistor for equal amount of time to equal bias conditions that cause a lingering change in transistor characteristics thereof.

According to at least one embodiment of the present invention, the recovering of data is performed by subjecting the two transistors to the same bias conditions (voltage conditions) for the same amount of time. During such recovering of data, the transistor having previously experienced a hot-carrier effect develops a larger change in its characteristics than the transistor having experienced no hot-carrier effect before. As a result, a difference in the transistor characteristics such as the threshold voltage between the two transistors becomes sufficiently large, so that the data initially stored and having diminished over time is restored to a sufficient level.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 1:
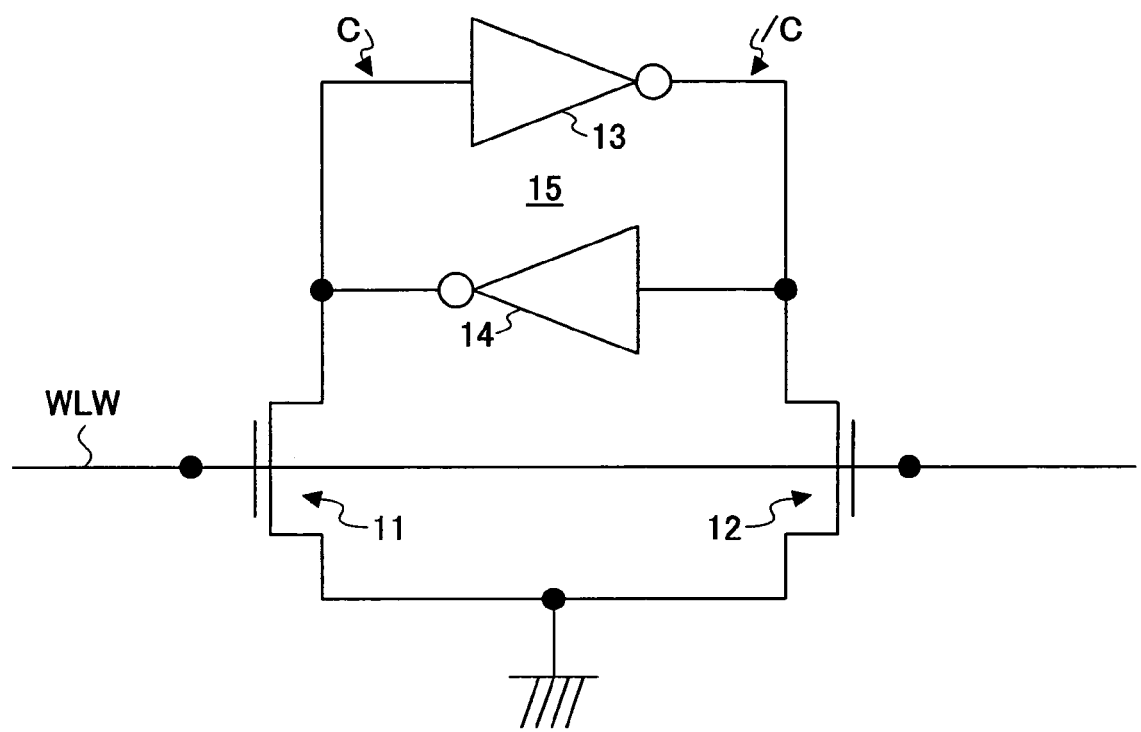
FIG. 1 is a circuit diagram showing a first embodiment of a nonvolatile semiconductor memory circuit according to the present invention.

FIG. 1 is a circuit diagram showing a first embodiment of a nonvolatile semiconductor memory circuit according to the present invention. In FIG. 1, the nonvolatile memory cell according to the present invention is comprised of n-channel silicon MOS transistors as a non-limiting example. Other transistors such as p-channel silicon MOS transistors may as well be used to form the nonvolatile memory cell according to the present invention.

A memory cell (i.e., a basic unit of data storage) 10 shown in FIG. 1 includes an NMOS transistor 11, an NMOS transistor 12, and inverters 13 and 14. The gate node of the NMOS transistor 11 and the gate node of the NMOS transistor 12 are coupled to a word selecting line WLW. One of the source/drain nodes of the NMOS transistor 11 is coupled to a predetermined potential (e.g, ground potential), and the other is coupled to an electrical node C. One of the source/drain nodes of the NMOS transistor 12 is coupled to the predetermined potential, and the other is coupled to an electrical node /C (the symbol "/" preceding another symbol indicates an inverse of the latter symbol). Each of the inverters 13 and 14 has the output thereof coupled to the input of one another, thereby forming a latch (flip-flop circuit) 15. The electrical node C and electrical node /C of the flip-flop circuit 15 have respective bi-stable potentials that are inverse to each other.

The NMOS transistor 11 and NMOS transistor 12 are conventional MIS (metal-insulating film-semiconductor) transistors. The NMOS transistor 11 and NMOS transistor 12 are designed such as to operate with a power supply voltage of 1.8 V, for example. Namely, when these transistors are driven with a voltage no greater than 1.8 V, a change in the characteristics due to a hot-carrier effect does not occur from a practical point of view.

Figure 2:
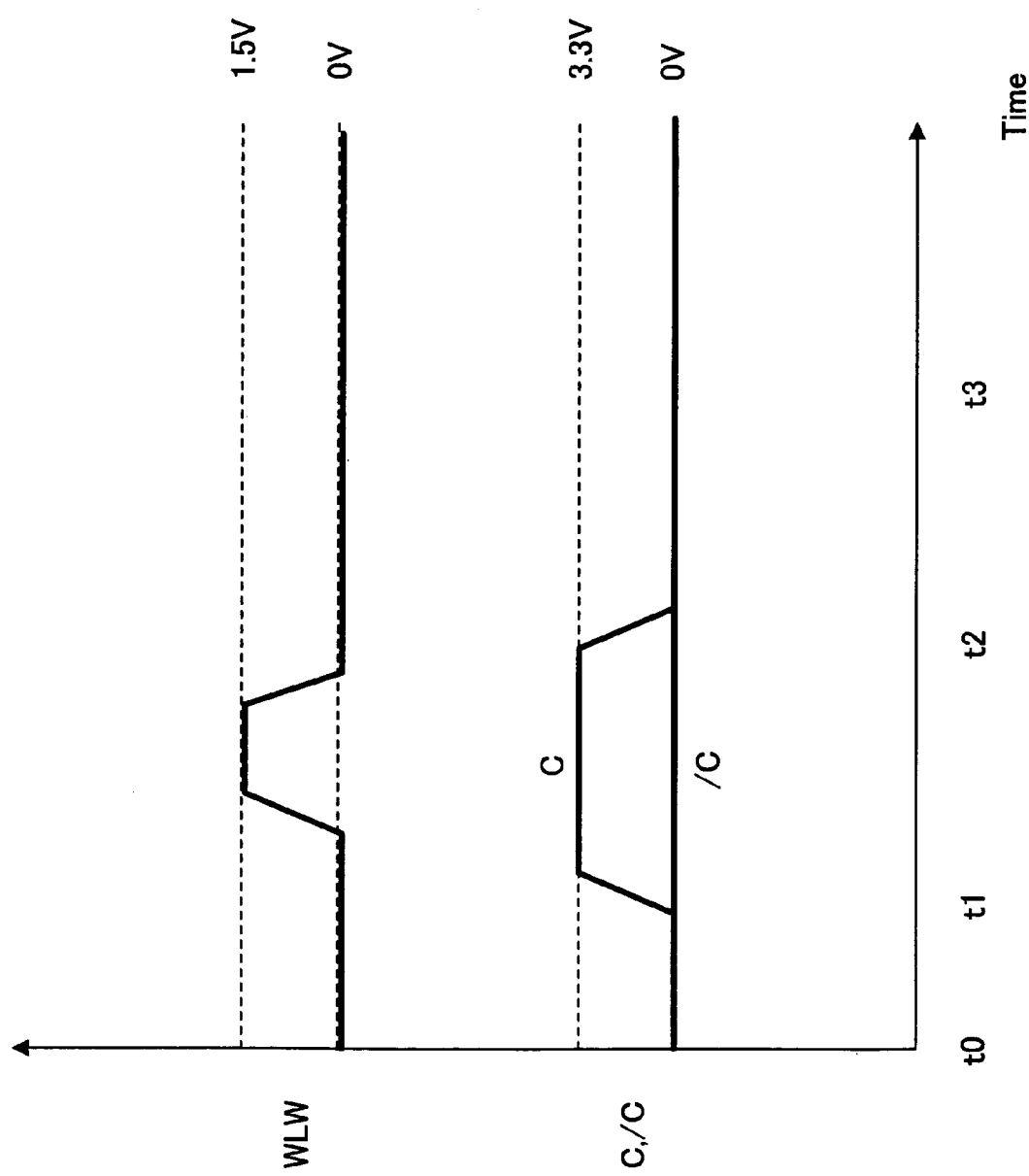
FIG. 2 is a drawing for explaining the data write operation of a memory cell shown in FIG. 1.

FIG. 2 is a drawing for explaining the data write operation of the memory cell 10 shown in FIG. 1. With reference to FIG. 2, the data write operation of the memory cell 10 will be described in the following.

The electrical nodes C and /C of the flip-flop circuit 15 are set to respective potentials that are inverse to each other. In an example shown in FIG. 2, the electrical node C is set to 3.3 V, and the electrical node /C is set to 0 V, for example. In order to create this potential state, these potentials may be applied to the electrical nodes C and /C from an exterior. Alternatively, these potentials may reflect the data stored in the flip-flop circuit 15.

After the electrical nodes C and /C are set to the respective potentials as described above, the word selecting line WLW is set to 1.5 V, for example. The potential of the word selecting line WLW is determined such as to maximize the effect of a hot-carrier phenomenon. Generally, such potential is selected to be half the voltage between the source node and drain node of the transistor that is subjected to a hot-carrier effect. In this example, the predetermined potential to which the source nodes of the NMOS transistors 11 and 12 are coupled is fixed to 0 V (ground potential).

In FIG. 2, a voltage of 3.3 V between the electrical node C and the ground potential is applied between the drain node and source node of the NMOS transistor 11 while the electrical node C is maintained at 3.3 V. Further, a voltage of 1.5 V between the word selecting line WLW and the ground potential is applied between the gate node and source node of the NMOS transistor 11. Since these bias voltages are larger than the voltages used in routine operations, the NMOS transistor 11 experiences a strong hot-carrier effect. Specifically, the application of the bias voltages for duration of 0.1 second to 1 second serves to generate a change in the characteristics that is substantially larger than the normal variation of the transistor characteristics. For example, the threshold voltage of the NMOS transistor 11 rises a few tens of millivolts. In other words, the channel resistance decreases approximately by 10%.

In the example described above, only the NMOS transistor 11 experiences a hot-carrier effect. The NMOS transistor 12 does not experience a hot-carrier effect because its drain node and source node are both set to 0 V.

If the potentials of the electrical nodes C and /C are reversed, with C being set to 0 V and /C being set to 3.3 V, the NMOS transistor 11 having 0 V applied to the drain node and source node thereof does not experience a hot-carrier effect. There is thus no lingering change in the transistor characteristics of the NMOS transistor 11. On the other hand, the NMOS transistor 12 experiences a hot-carrier effect.

The hot-carrier effect as described above leaves a lingering change in the transistor characteristics. Changes in the characteristics of the NMOS transistor 11 and NMOS transistor 12 caused by the hot-carrier effect thus achieve a nonvolatile data retention that reflects the initial potential settings of the electrical nodes C and /C.

Figure 3:
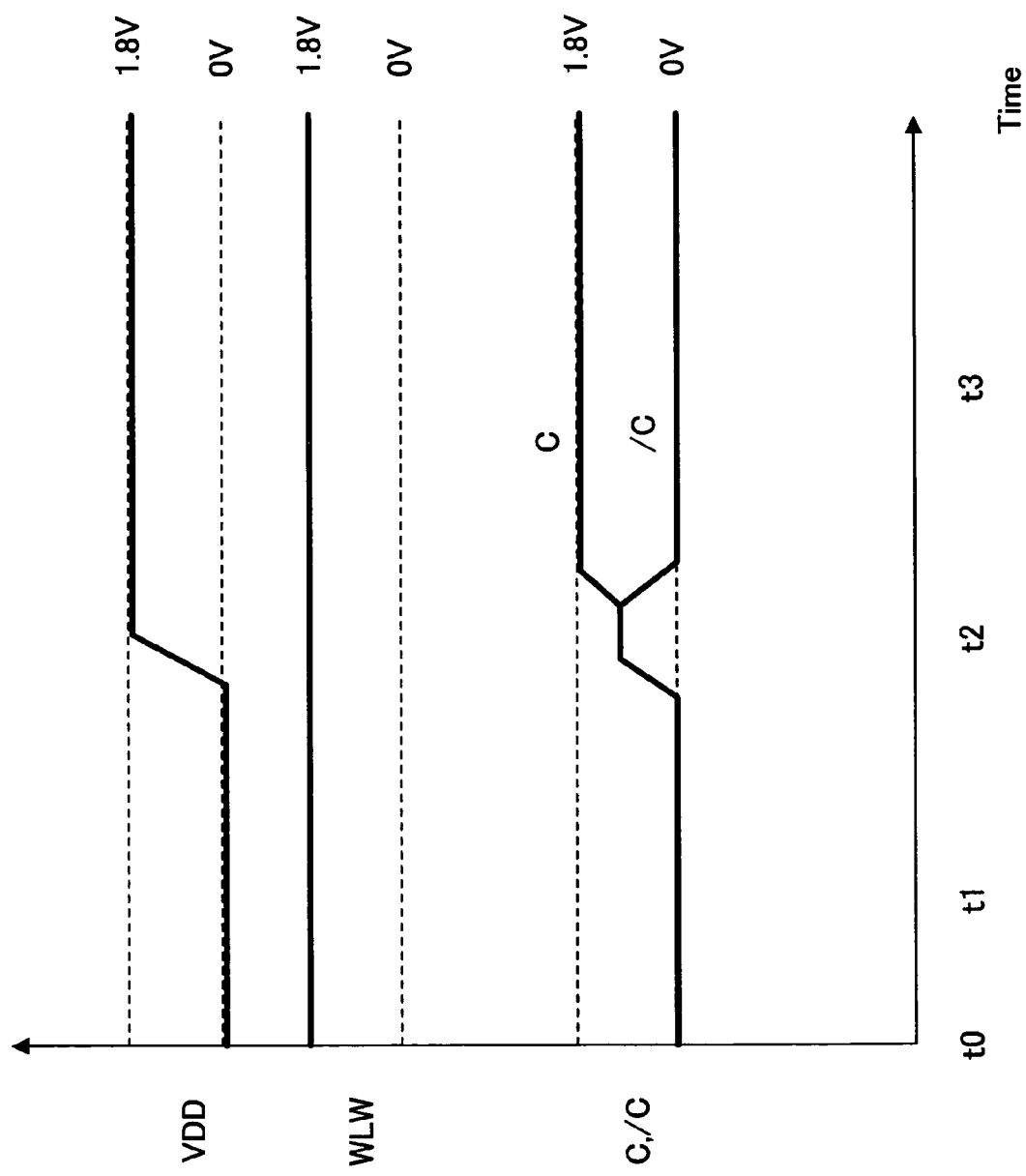
FIG. 3 is a drawing for explaining the data read operation of the memory cell shown in FIG. 1.

FIG. 3 is a drawing for explaining the data read operation of the memory cell 10 shown in FIG. 1. With reference to FIG. 3, the data read operation of the memory cell 10 will be described in the following.

In order to read the data from the NMOS transistor 11 and the NMOS transistor 12, the flip-flop circuit 15 comprised the inverters 13 and 14 is switched from an electrically inactive state to an electrically active state. This may be achieved by shifting the power supply voltage VDD applied to the inverters 13 and 14 from 0 V to 1.8 V as shown in FIG. 3. The potential of the word selecting line WLW is set to 1.8 V prior to the activation of the flip-flop circuit 15.

In a first case, the NMOS transistor 11 has a lingering change in the characteristics due to a hot-carrier effect (such as an increase in the threshold voltage or a decrease in the ON current), whereas the NMOS transistor 12 does not have such a lingering change in the characteristics. In this case, the force that pulls down the electrical node C is weaker than the force that pulls down the electrical node /C. After the activation of the flip-flop circuit 15, therefore, the electrical node C is set to the HIGH level, and the electrical node /C is set to the LOW level.

In a second case, the NMOS transistor 12 has a lingering change in the characteristics due to a hot-carrier effect (such as an increase in the threshold voltage or a decrease in the ON current), whereas the NMOS transistor 11 does not have such a lingering change in the characteristics. In this case, the force that pulls down the electrical node C is stronger than the force that pulls down the electrical node /C. After the activation of the flip-flop circuit 15, therefore, the electrical node C is set to the LOW level, and the electrical node /C is set to the HIGH level.

In this manner, the configuration shown in FIG. 1 can store data in a nonvolatile manner through a hot-carrier effect, and can detect (sense) the stored data.

In the nonvolatile memory circuit as shown in FIG. 1, without any countermeasure, a change in the transistor characteristics created by a hot-carrier effect diminishes with the passage of time. Namely, a margin for read operations may decrease, which may further result in the loss of data. In the following, a description will be given of what kind of physical changes are occurring to decrease a change in the transistor characteristics created by a hot-carrier effect.

One of the factors causing such decrease is the escaping of electrons trapped in the gate-oxide film. There is a Coulomb potential having a concave shape in the gate-oxide film, which traps electrons therein. Some of the barrier heights are close to the energy of thermal motion. As the temperature of the device increases, the trapped electrons begin to escape.

Another one of the factors is the annealing effect of hydrogen. The gate-oxide-film interface, when exposed to hot carriers, creates dangling bolds of Si atoms. These dangling bonds electrically function as an interface state, causing a change in the transistor characteristics. As time passes, free hydrogen atoms couple with the dangling bonds, resulting in a decrease in the interface state. Such annealing effect occurs with increasing likelihood as the temperature of the device increases.

The present invention performs the rewriting of data so as to prevent data loss. In so doing, the present invention utilizes the fact that a gate-oxide film having cured from the damage caused by a hot-carrier effect develops a hot-carrier-effect-induced change in its characteristics with greater rapidity than a gate-oxide film having never sustained such damage. Specifically, the NMOS transistors 11 and 12 are subjected to the same voltage conditions for causing a hot-carrier effect for the same amount of time. As a result, one of the transistors having experienced a greater hot-carrier effect has a greater change in the characteristics, thereby achieving the recovery of the stored data.

Figure 4:
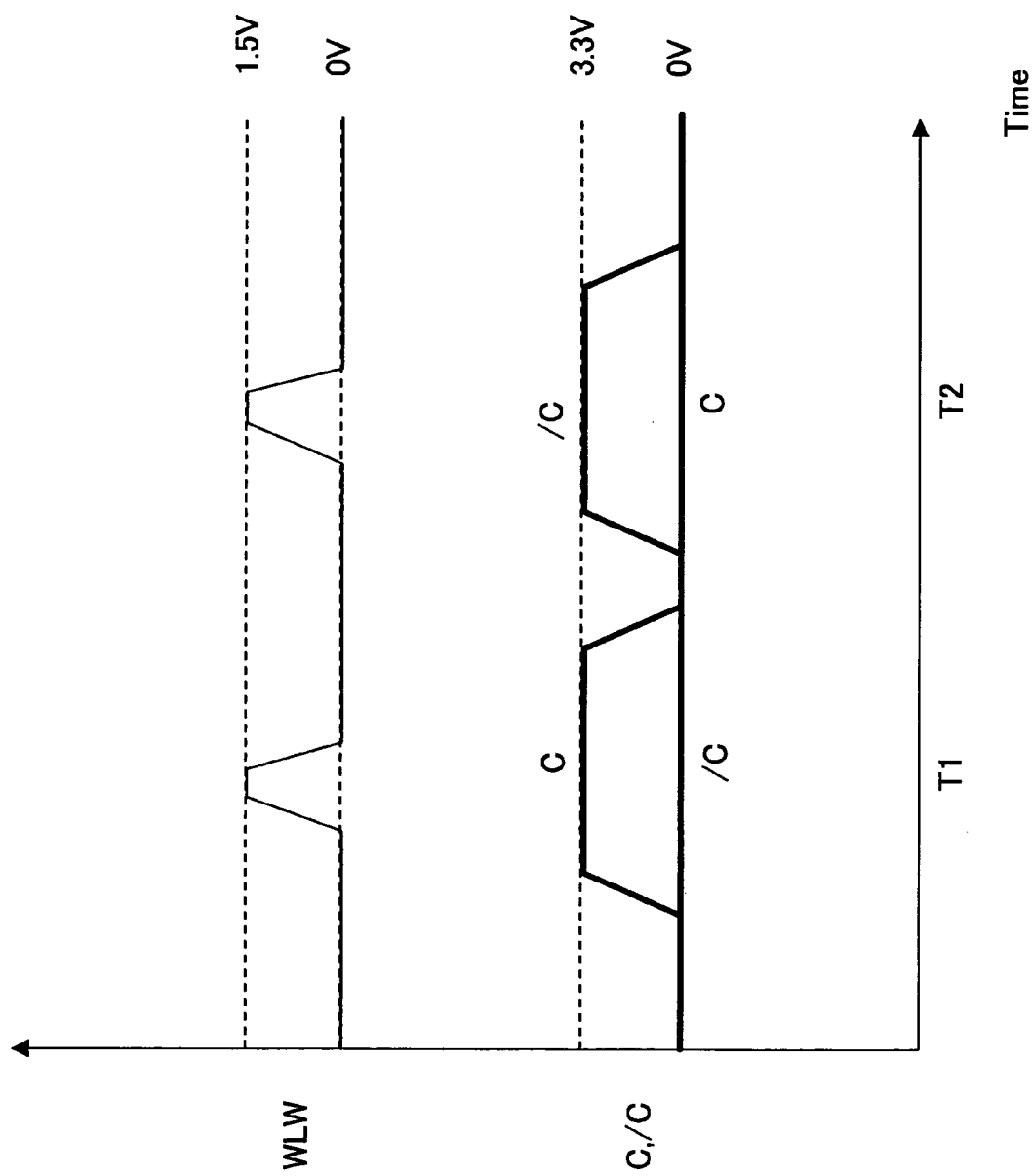
FIG. 4 is a drawing for explaining a sequence for inducing the same amount of hot-carrier effect in NMOS transistors.

FIG. 4 is a drawing for explaining a sequence for inducing the same amount of hot-carrier effect in the NMOS transistors 11 and 12.

First, the electrical node C and electrical node /C of the flip-flop circuit 15 are set to respective potentials that are inverse to each other. The word selecting line WLW is then raised to 1.5 V. The duration during which the word selecting line WLW is kept at 1.5 V may be 50 milliseconds, for example. With the electrical node C maintained at 3.3 V, the drain and source nodes of the NMOS transistor 11 has a voltage gap of 3.3 V therebetween, which is equal to the potential of the electrical node C and the ground potential. Further, the gate and source nodes of the NMOS transistor 11 have a voltage gap of 1.5 V therebetween, which is equal to the potential of the word selecting line WLW and the ground potential. With this provision, a hot-carrier effect is induced in the NMOS transistor 11.

Next, the data of the flip-flop circuit 15 is inverted so as to set the electrical nodes C and /C to the respective potentials that are reverse to the previous potentials. The word selecting line WLW is then set to the same potential for the same duration as in the previous operation, i.e., kept at 1.5 V for 50 milliseconds, for example. With the electrical node /C maintained at 3.3 V, the drain and source nodes of the NMOS transistor 12 has a voltage gap of 3.3 V therebetween, which is equal to the potential of the electrical node /C and the ground potential. Further, the gate and source nodes of the NMOS transistor 12 have a voltage gap of 1.5 V therebetween, which is equal to the potential of the word selecting line WLW and the ground potential. With this provision, a hot-carrier effect is induced in the NMOS transistor 12.

Figure 5:
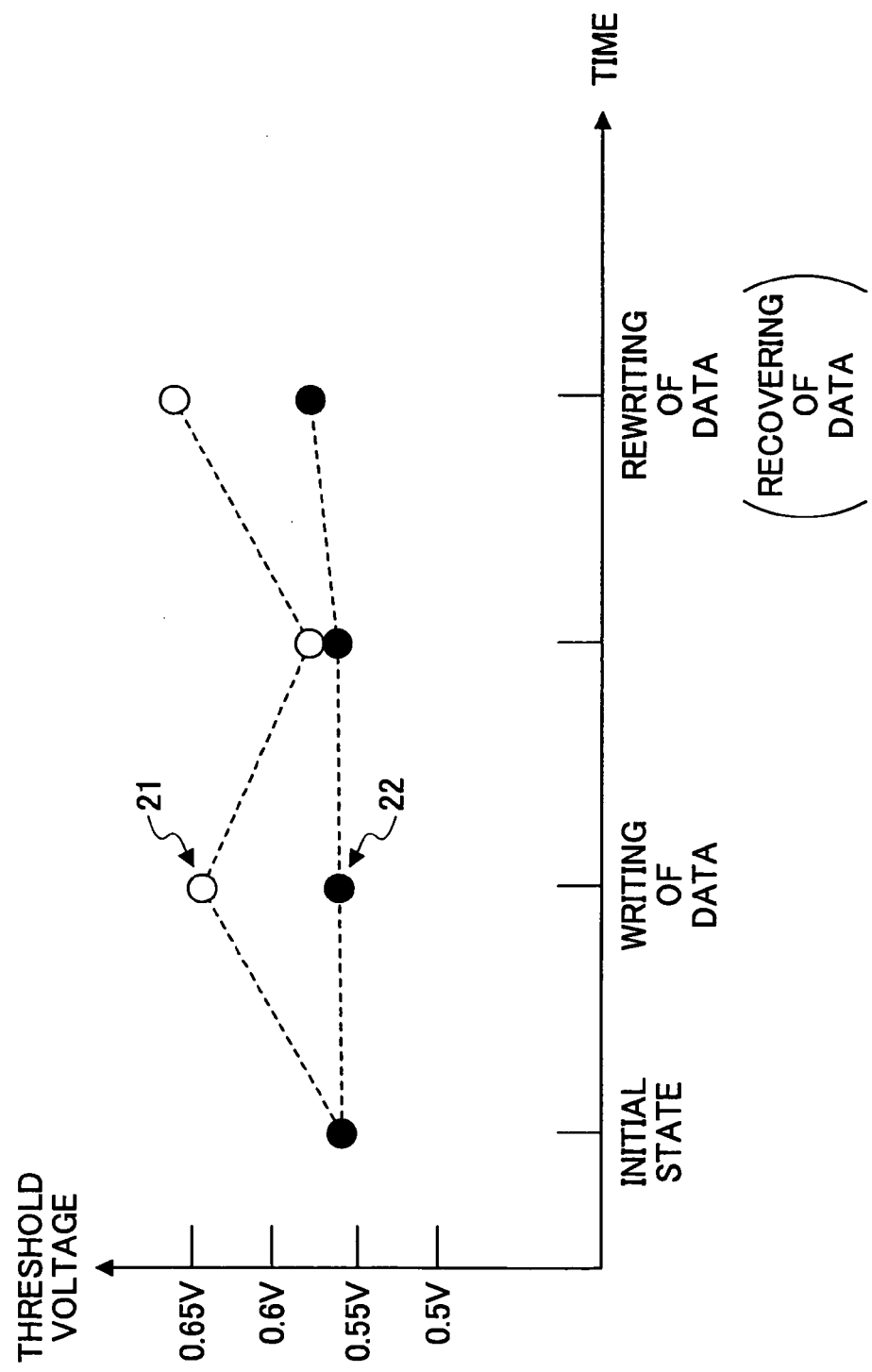
FIG. 5 is a drawing showing changes in the threshold voltage associated with the writing, diminishing, and rewriting of data according to the present invention.

FIG. 5 is a drawing showing changes in the threshold voltage associated with the writing, diminishing, and rewriting of data according to the present invention. In FIG. 5, open circle plots 21 represent the threshold voltage of a transistor that is subjected to a hot-carrier effect at the time of initial writing of data, and solid circuit plots 22 represent the threshold voltage of a transistor that is not subjected to a hot-carrier effect at the time of initial writing of data.

At the initial state, these two transistors have substantially the same threshold voltage. At the time of writing data, one of the transistors is subjected to a hot-carrier effect, so that an imbalance in the characteristics develops between the two transistors. Such imbalance is shown as a difference in the threshold voltage in FIG. 5.

Due to the physical changes as previously described, a hot-carrier-effect-induced increase in the threshold voltage diminishes with time, and the threshold voltage approaches to its original level. After a substantially long period of time, a difference in the threshold voltage between the two transistors becomes so small that a read operation may fail.

In the present invention, as shown in FIG. 5, the rewriting of data (recovering of data) is performed by subjecting the two transistors to the same bias conditions (voltage conditions) for the same amount of time. During such recovering of data, the transistor having previously experienced a hot-carrier effect develops a larger change in its characteristics than the transistor having experienced no hot-carrier effect before. This is because the gate-oxide film having cured from the damage caused by a hot-carrier effect develops a hot-carrier-effect-induced change with greater rapidity than the gate-oxide film having sustained no damage. As a result, a difference in the threshold voltage between the two transistors becomes sufficiently large, so that the data initially stored and having diminished over time is restored to a sufficient level.

Figure 6:
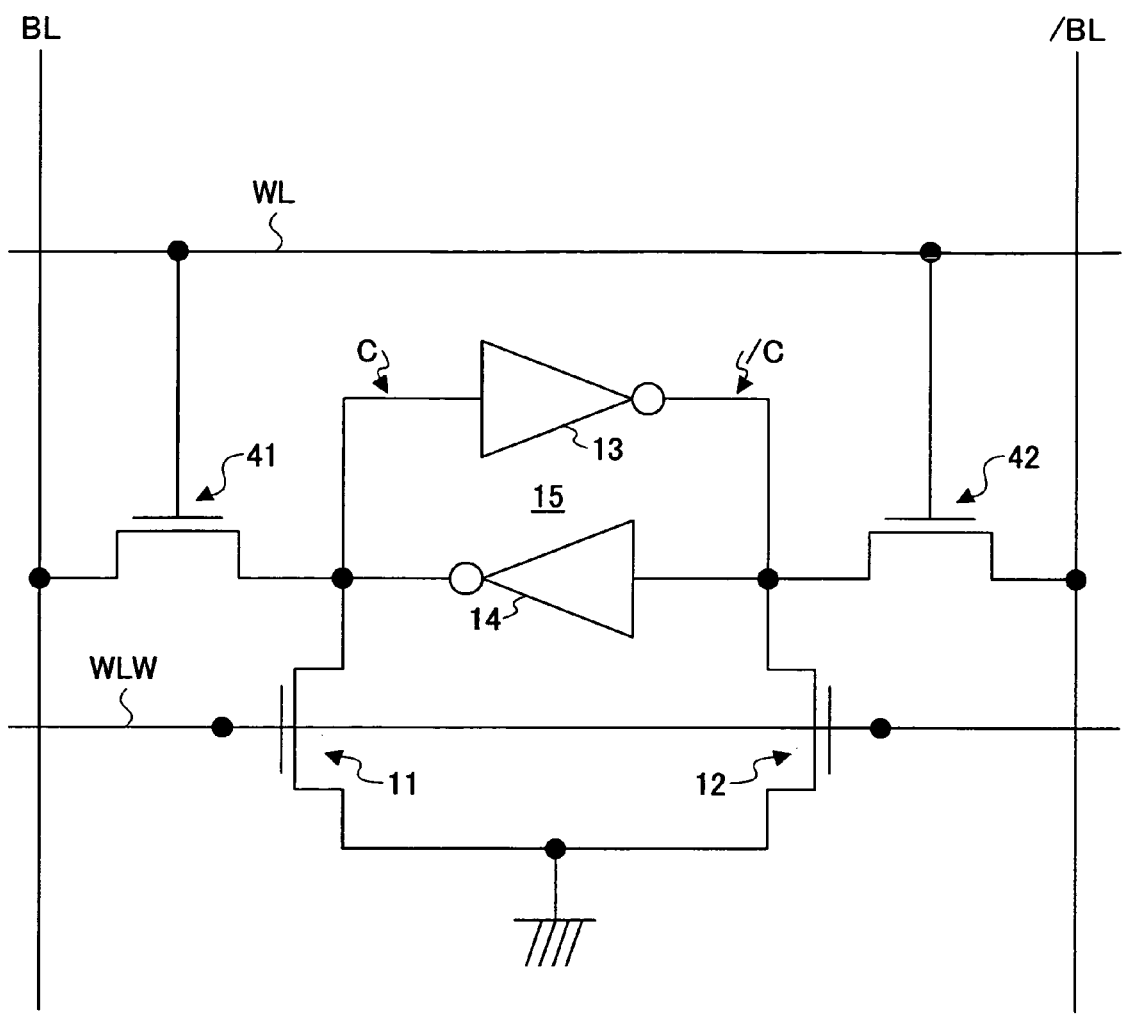
FIG. 6 is a circuit diagram showing a second embodiment of the nonvolatile semiconductor memory circuit according to the present invention.

FIG. 6 is a circuit diagram showing a second embodiment of the nonvolatile semiconductor memory circuit according to the present invention. In FIG. 6, the same elements as those of FIG. 1 are referred to by the same numerals, and a description thereof will be omitted.

Compared with the configuration shown in FIG. 1, FIG. 6 illustrates the memory cell 10 together with surrounding circuit elements, which include bit lines BL and /BL, a word line WL, and NMOS transistors 41 and 42. The NMOS transistor 41 provides a coupling between the electrical node C and the bit line BL. The NMOS transistor 42 provides a coupling between the electrical node /C and the bit line /BL. With this provision, it is possible to control the inputting/outputting of data into/from the flip-flop circuit 15 through the NMOS transistors 41 and 42.

When the word line WL is activated to HIGH, the NMOS transistors 41 and 42 become conductive. The data stored in the flip-flop circuit 15 is thus read to the bit lines BL and /BL. If the bit lines BL and /BL are externally forced to respective potentials, on the other hand, the data represented by the bit line potentials is stored in the flip-flop circuit 15 through the NMOS transistors 41 and 42.

Figure 7:
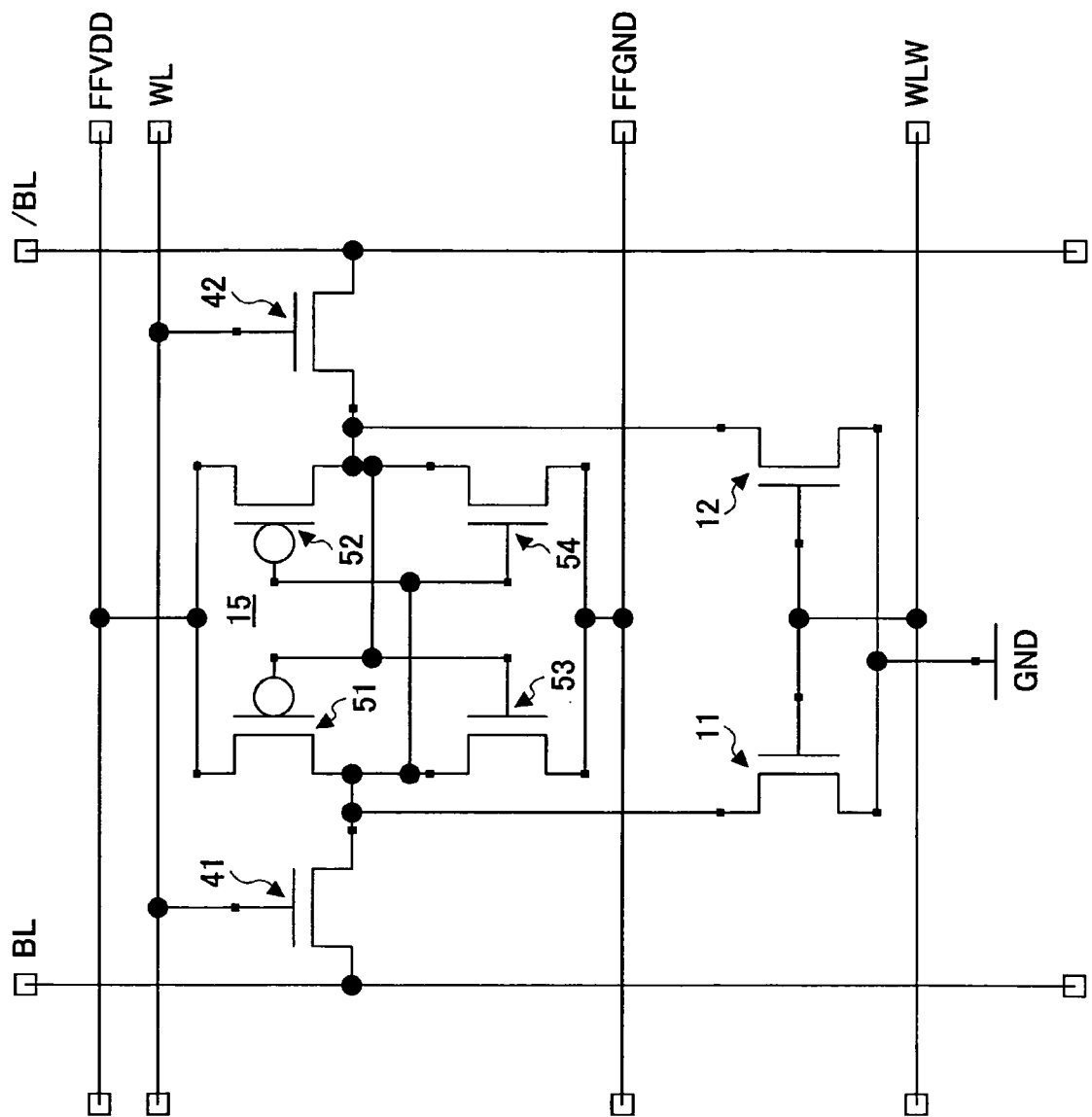
FIG. 7 is a circuit diagram showing a detailed configuration of the circuit shown in FIG. 6.

FIG. 7 is a circuit diagram showing a detailed configuration of the circuit shown in FIG. 6. In FIG. 7, the same elements as those of FIG. 6 are referred to by the same numerals, and a description thereof will be omitted.

In FIG. 7, the flip-flop circuit 15 includes PMOS transistors 51 and 52 and NMOS transistors 53 and 54. The PMOS transistor 51 and the NMOS transistor 53 form a first inverter (corresponding to the inverter 14 in FIG. 6), and the PMOS transistor 52 and the NMOS transistor 54 form a second inverter (corresponding to the inverter 13 in FIG. 6). The flip-flop circuit 15 receives a power supply voltage FFVDD and a ground voltage FFGND. Setting the power supply voltage FFVDD to HIGH and the ground voltage FFGND to LOW places the flip-flop circuit 15 in an activated state. Setting the power supply voltage FFVDD to LOW and the ground voltage FFGND to LOW places the flip-flop circuit 15 in a deactivated state. In this manner, the activation/deactivation of the flip-flop circuit 15 is readily controlled by manipulating the the power supply voltage FFVDD and the ground voltage FFGND. Such control is necessary in order to read data from the NMOS transistors 11 and 12 as described in connection with FIG. 3.

Figure 8:
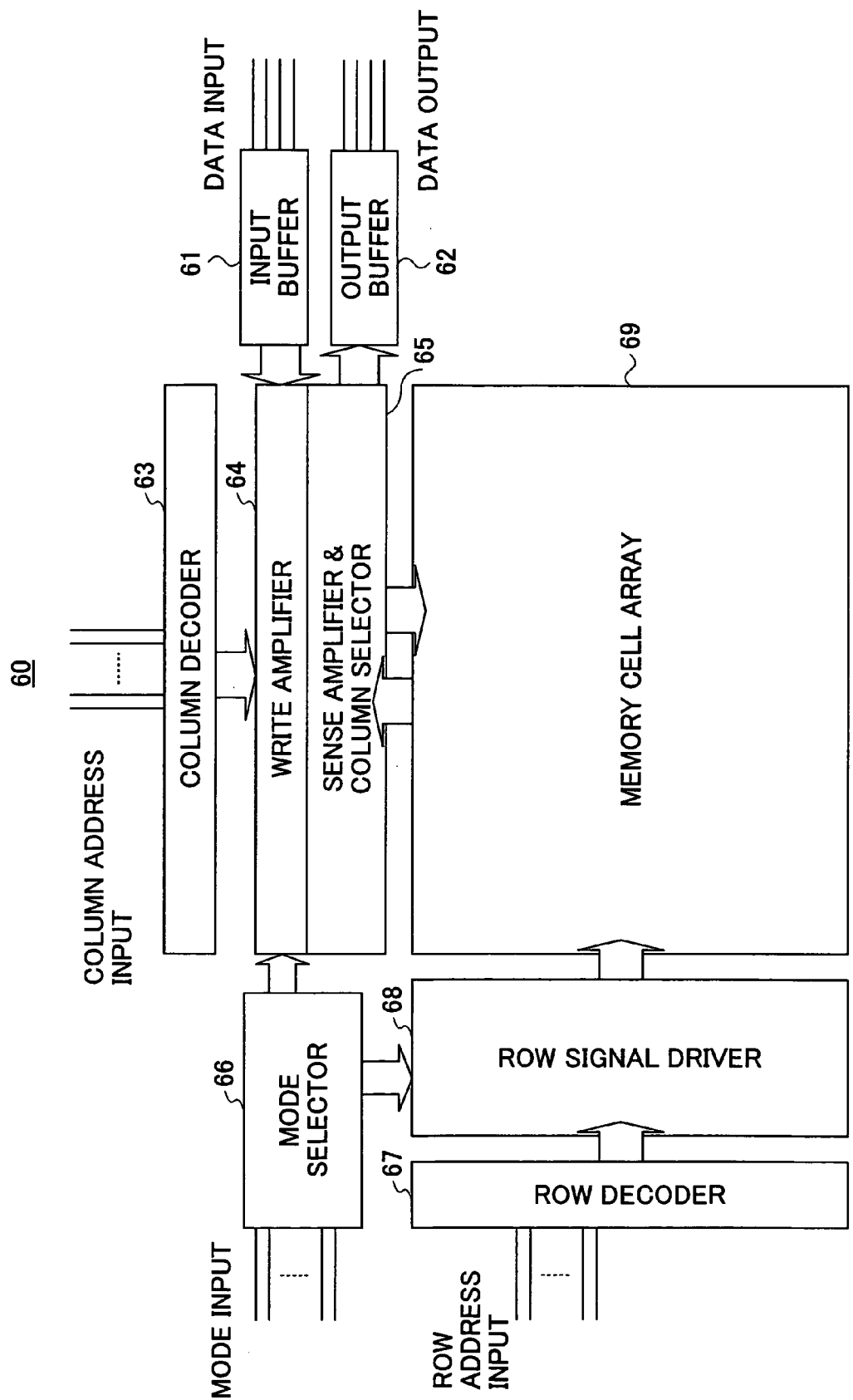
FIG. 8 is a block diagram showing the configuration of a nonvolatile semiconductor memory device according to the present invention.

FIG. 8 is a block diagram showing the configuration of a nonvolatile semiconductor memory device according to the present invention. A semiconductor memory device 60 shown in FIG. 8 includes an input buffer 61, an output buffer 62, a column decoder 63, a write amplifier 64, a sense amplifier & column selector 65, a mode selector 66, a row decoder 67, a row signal driver 68, and a memory cell array 69.

The memory cell array 69 includes a plurality of memory cells arranged in a matrix form, each memory cell having a circuit configuration as shown in FIG. 7, for example. The memory cells arranged in the same column are connected to the same bit lines, and the memory cells arranged in the same row are connected to the same word line. The memory cells arranged in the same row may be connected to the same word selecting line WLW (see FIG. 7, for example), which is however not an essential feature of the present invention.

The mode selector 66 receives mode input signals from an exterior of the device, and decodes the mode input signal to determine an operation mode (e.g., a write operation mode or a read operation mode). Control signals responsive to the determined operation mode are supplied to the write amplifier 64, the sense amplifier & column selector 65, the row signal driver 68, etc., for control of the individual parts of the semiconductor memory device 60.

The column decoder 63 receives a column address input from the exterior of the device, and decodes the column address input to determine a selected column. The decode signals indicative of the selected column are supplied to the write amplifier 64 and the sense amplifier & column selector 65.

The row decoder 67 receives a row address input from the exterior of the device, and decodes the row address input to determine a selected row. The decode signals indicative of the selected row are supplied to the row signal driver 68.

In response to the control signals from the mode selector 66 and the decode signals from the row decoder 67, the row signal driver 68 activates a selected word line among the word lines extending from the row signal driver 68. As a result of the activation of the selected word line, the flip-flop circuit 15 (see FIG. 7) of each memory cell connected to the selected word line is coupled to a corresponding bit line pair among a plurality of bit line pairs. Through this coupling, the writing/reading of data to/from the flip-flop circuit 15 is performed.

In response to the control signals from the mode selector 66 and the decode signals from the column decoder 63, the sense amplifier & column selector 65 couples bit lines corresponding to the selected column to a data bus. Through this coupling, data is transferred between the memory cell array 69 and the data bus. The sense amplifier & column selector 65 amplifies the data read from the memory cell array 69 for provision to the output buffer 62. The data is output from the output buffer 62 to the exterior of the device as output data. Input data supplied to the input buffer 61 is provided to the write amplifier 64. The write amplifier 64 amplifies the input data to be written to the memory cell array 69.

Figure 9:
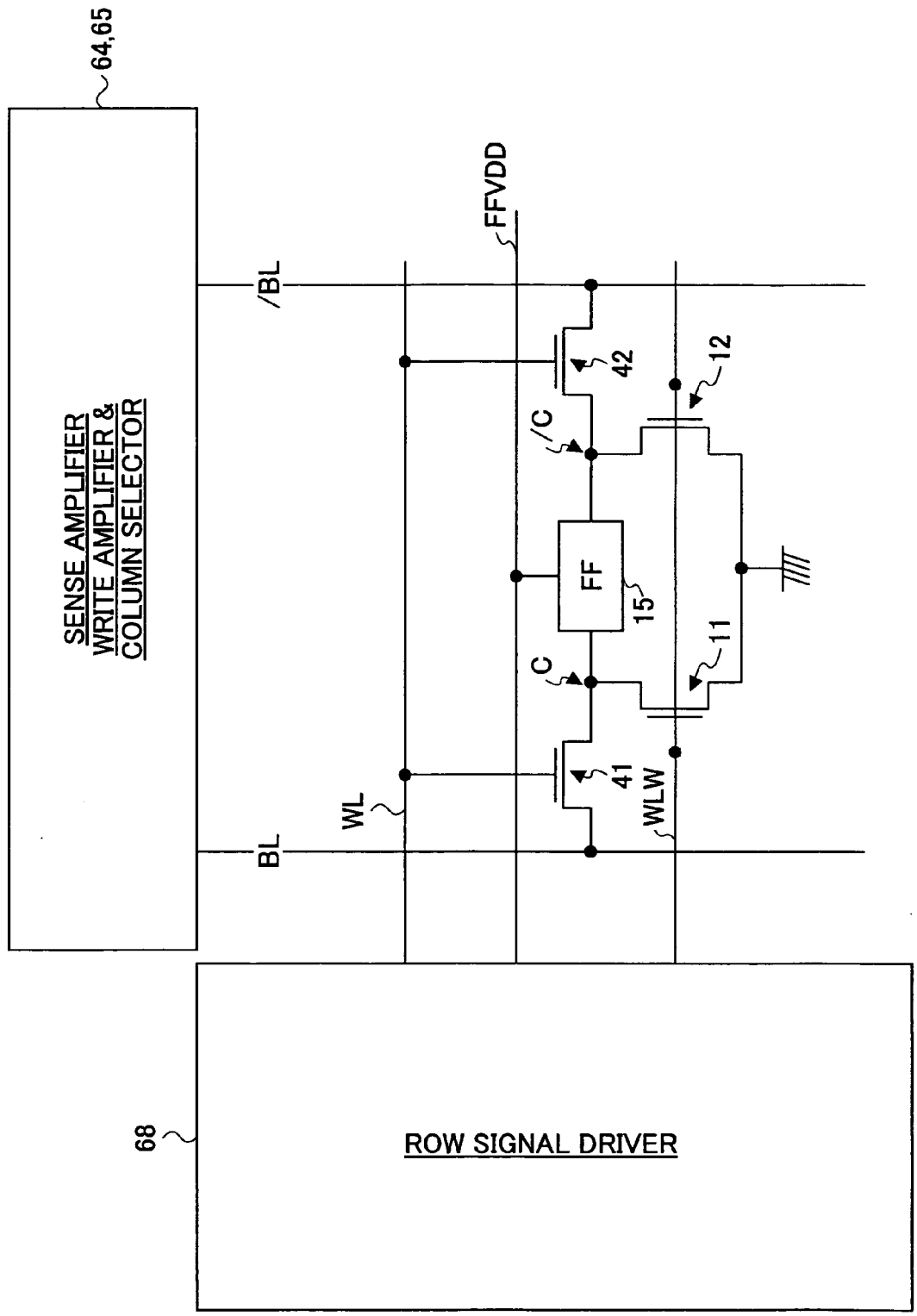
FIG. 9 is an illustrative drawing showing connections between a memory cell and a write amplifier, a sense amplifier & column selector, and a row signal driver.

FIG. 9 is an illustrative drawing showing the connections between a memory cell and the write amplifier 64, the sense amplifier & column selector 65, and the row signal driver 68. As shown in FIG. 9, the bit lines BL and /BL extend from the write amplifier 64 and the sense amplifier & column selector 65, and are coupled to a memory cell (comprised of the NMOS transistors 11 and 12 and the flip-flop circuit 15) via the NMOS transistors 41 and 42. The word selecting line WLW extends from the row signal driver 68, and is coupled to the memory cell. The word line WL extends from the row signal driver 68 to be connected to the gates of the NMOS transistors 41 and 42. Further, a power supply line for supplying the voltage FFVDD (see FIG. 7) may extend from the row signal driver 68 to be connected to the flip-flop circuit 15.

It should be noted that the configuration shown in FIG. 9 is identical with respect to each and every one of the memory cells provided in the memory cell array 69. Namely, a plurality of word lines, a plurality of word selecting lines, and a plurality of power supply lines run in parallel in the memory cell array 69, and are connected to the corresponding memory cells.

When data is written to or read from the flip-flop circuit 15, the row signal driver 68 activates the word line WL to couple the flip-flop circuit 15 to the bit lines BL and /BL. In the case of a data write operation, the bit lines BL and /BL are set to respective potentials by the write amplifier 64, so that the data corresponding to the bit line potentials is written to the flip-flop circuit 15. In the case of a data read operation, data potentials appearing on the bit lines BL and /BL in response to the data stored in the flip-flop circuit 15 are amplified by the sense amplifier & column selector 65 for provision to the exterior of the device as output data.

If there is a need to store the data of the flip-flop circuit 15 in a nonvolatile manner, the row signal driver 68 sets the word selecting line WLW to 1.5 V as shown in FIG. 2. Further, the row signal driver 68 may set the power supply potential FFVDD to 3.3 V or more, so that the flip-flop circuit 15 is driven with the 3.3V operating voltage, resulting in one of the electrical nodes C and /C being set to 3.3 V and the other being set to 0 V. This causes the NMOS transistor 11 or the NMOS transistor 12 to experience a hot-carrier effect, whichever is selected according to the data stored in the flip-flop circuit 15.

If there is a need to read the data stored in the NMOS transistors 11 and 12, the flip-flop circuit 15 is switched from an electrically inactive state to an electrically active state. This may be achieved by shifting the power supply voltage FFVDD applied to the flip-flop circuit 15 from 0 V to 1.8 V. Further, the row signal driver 68 sets the potential of the word selecting line WLW to 1.8 V before the flip-flop circuit 15 is activated.

If there is a need to rewrite (recover) the data stored in the NMOS transistors 11 and 12, a command (mode inputs) indicative of data recovery may be entered from the exterior to the mode selector 66 (FIG. 8). The mode selector 66 decodes the command, and generates controls signals for performing the recovery sequence as shown in FIG. 4. Since the data stored in the flip-flop circuit 15 is destroyed during this recovery sequence, such recovery command may be entered during the initialization of the system in which the semiconductor memory device 60 is incorporated, for example.

According to the control signals generated by the mode selector 66, the row signal driver 68 activates the word line WL (FIG. 9) to make the NMOS transistors 41 and 42 conductive, and the write amplifier 64 sets the bit lines BL and /BL to HIGH and LOW, respectively, thereby setting the electrical nodes C and /C to HIGH and LOW, respectively. The mode selector 66 then raises the power supply potential FFVDD to 3.3 V or more, such that the potential of the electrical node C becomes 3.3 V. The mode selector 66 further activates the word selecting line WLW by applying a 1.5V potential thereto. This achieves the first recovery phase as performed at time T1 in FIG. 4, resulting in a hot-carrier effect being induced in the NMOS transistor 11.

After this, the second recovery phase as performed at time T2 in FIG. 4 is carried out. Namely, in response to the control signals generated by the mode selector 66, the row signal driver 68 activates the word line WL (FIG. 9) to make the NMOS transistors 41 and 42 conductive, and the write amplifier 64 sets the bit lines BL and /BL to LOW and HIGH, respectively, thereby setting the electrical nodes C and /C to LOW and HIGH, respectively. The mode selector 66 then raises the power supply potential FFVDD to 3.3 V or more, such that the potential of the electrical node /C becomes 3.3 V. The mode selector 66 further activates the word selecting line WLW by applying a 1.5V potential thereto. This results in a hot-carrier effect being induced in the NMOS transistor 11.

Although the NMOS transistors 11 and 12 are subjected to the same bias conditions (voltage conditions) for the same amount of time, the transistor having previously experienced a hot-carrier effect develops a larger change in its characteristics than the transistor having experienced no hot-carrier effect before. As a result, the data initially stored and having diminished over time is restored to a sufficient level. In this manner, the mode selector 66, the write amplifier 64, and the row signal driver 68 together serve as a control circuit to perform the recovery process of the present invention.

In the present invention, the recovery of data may be performed upon request from the system as in the above-described example. Such a request may be issued at constant intervals upon finding that a predetermined number of days have passed since the last time the recovery was performed, for example. A check to determine whether the time has come for the recovery process to be carried out may be performed each time the system is powered on, for example. Alternatively, such a check may be performed once a day or once a month, for example. The timing at which the check and recovery process is performed may be a matter of system design, and may be determined as appropriate according to the needs of the system.

Further, the present invention is not limited to these embodiments, but various variations and modifications may be made without departing from the scope of the present invention.

What is claimed is:

1. A memory circuit, comprising:
    a latch having a first node and a second node configured to be bi-stable with a potential of the first node inverse to a potential of the second node;
    a word selecting line;
    a first MIS transistor having one of source/drain nodes thereof coupled to the first node of said latch, another one of the source/drain nodes thereof coupled to a predetermined node, and a gate node thereof coupled to said word selecting line;
    a second MIS transistor having one of source/drain nodes thereof coupled to the second node of said latch, another one of the source/drain nodes thereof coupled to said predetermined node, and a gate node thereof coupled to said word selecting line; and
    a control circuit configured to subject in a write mode, one of said first MIS transistor and said second MIS transistor to bias conditions that cause a lingering change in transistor characteristics thereof, and to subject in a recovery mode both said first MIS transistor and said second MIS transistor for equal amount of time to equal bias conditions that cause a lingering change in transistor characteristics thereof.

2. The memory circuit as claimed in claim 1, wherein said control circuit is configured to set the first node, the second node, and the word selecting line to a first potential, a second potential, and a third potential, respectively, in the write mode, and is configured to set the first node, the second node, and the word selecting line to the first potential, the second potential, and the third potential, respectively, in a first half of the recovery mode, and to set the first node, the second node, and the word selecting line to the second potential, the first potential, and the third potential, respectively, in a second half of the recovery mode.

3. The memory circuit as claimed in claim 2, wherein the third potential is situated between the first potential and the second potential.

4. The memory circuit as claimed in claim 2, wherein one of the first potential and the second potential is higher than a normal operating potential of said first MIS transistor and said second MIS transistor.

5. The memory circuit as claimed in claim 1, wherein said control circuit is configured to activate said latch while applying a predetermined potential to said word selecting line, thereby causing said latch to store data responsive to the lingering change in the transistor characteristics.

6. The memory circuit as claimed in claim 1, further comprising a power supply line coupled between said control circuit and said latch, said control circuit being configured to control activation and deactivation of said latch through said power supply line.

7. The memory circuit as claimed in claim 6, wherein said control circuit is configured to control an operating voltage of said latch through said power supply line.

8. The memory circuit as claimed in claim 7, wherein said control circuit is configured to deactivate said latch such as to set the first node and the second node to a common potential at a first stage of a read mode, and is configured to activate said latch and set said word selecting line to a predetermined potential at a second stage of the read mode, thereby causing said latch to store data responsive to the lingering change in the transistor characteristics.

9. A semiconductor memory device, comprising:
a control circuit;
word lines extending from said control circuit;
word selecting lines extending from said control circuit;
a plurality of memory units arranged in a matrix, one of said memory units coupled to a first bit line and a second bit line, said one of said memory units including:
a latch having a first node and a second node configured to be bi-stable with a potential of the first node inverse to a potential of the second node;
a first MIS transistor having one of source/drain nodes thereof coupled to the first node of said latch, another one of the source/drain nodes thereof coupled to a predetermined node, and a gate node thereof coupled to said word selecting line;
a second MIS transistor having one of source/drain nodes thereof coupled to the second node of said latch, another one of the source/drain nodes thereof coupled to said predetermined node, and a gate node thereof coupled to said word selecting line;
a third transistor having a gate thereof coupled to one of said word lines and source/drain nodes thereof coupled to the first node and the first bit line, respectively; and
a fourth transistor having a gate thereof coupled to said one of said word lines and source/drain nodes thereof coupled to the second node and the second bit line, respectively,
wherein said control circuit is configured to subject in a write mode, one of said first MIS transistor and said second MIS transistor to bias conditions that cause a lingering change in transistor characteristics thereof, and to subject in a recovery mode both said first MIS transistor and said second MIS transistor for equal amount of time to equal bias conditions that cause a lingering change in transistor characteristics thereof.

10. The memory circuit as claimed in claim 9, wherein said control circuit is configured to set the first node, the second node, and the word selecting line to a first potential, a second potential, and a third potential, respectively, in the write mode, and is configured to set the first node, the second node, and the word selecting line to the first potential, the second potential, and the third potential, respectively, in a first half of the recovery mode, and to set the first node, the second node, and the word selecting line to the second potential, the first potential, and the third potential, respectively, in a second half of the recovery mode.

11. The memory circuit as claimed in claim 10, wherein the third potential is situated between the first potential and the second potential.

12. The memory circuit as claimed in claim 10, wherein one of the first potential and the second potential is higher than a normal operating potential of said first MIS transistor and said second MIS transistor.

13. The memory circuit as claimed in claim 9, wherein said control circuit is configured to activate said latch while applying a predetermined potential to said word selecting line, thereby causing said latch to store data responsive to the lingering change in the transistor characteristics.

14. The memory circuit as claimed in claim 9, further comprising a power supply line coupled between said control circuit and said latch, said control circuit being configured to control activation and deactivation of said latch through said power supply line.

15. The memory circuit as claimed in claim 14, wherein said control circuit is configured to control an operating voltage of said latch through said power supply line.

16. The memory circuit as claimed in claim 15, wherein said control circuit is configured to deactivate said latch such as to set the first node and the second node to a common potential at a first stage of a read mode, and is configured to activate said latch and set said word selecting line to a predetermined potential at a second stage of the read mode, thereby causing said latch to store data responsive to the lingering change in the transistor characteristics.

17. A method of writing and recovering data in a memory cell, which includes a word selecting line, a first MIS transistor having one of source/drain nodes thereof coupled to a first node, another one of the source/drain nodes thereof coupled to a common node, and a gate node thereof coupled to said word selecting line, and a second MIS transistor having one of source/drain nodes thereof coupled to a second node, another one of the source/drain nodes thereof coupled to said common node, and a gate node thereof coupled to said word selecting line, said method comprising:
a write step of subjecting one of said first MIS transistor and said second MIS transistor to bias conditions that cause a lingering change in transistor characteristics thereof; and
a recovery step of subjecting both said first MIS transistor and said second MIS transistor for equal amount of time to equal bias conditions that cause a lingering change in transistor characteristics thereof.

18. The method as claimed in claim 17, wherein said write step includes a step of setting the first node, the second node, and the word selecting line to a first potential, a second potential, and a third potential, respectively, and said recovery step includes:
  setting the first node, the second node, and the word selecting line to the first potential, the second potential, and the third potential, respectively, in a first half of a recovery mode; and
  setting the first node, the second node, and the word selecting line to the second potential, the first potential, and the third potential, respectively, in a second half of the recovery mode.

* * * * *